(12) United States Patent
Luo et al.

(10) Patent No.: US 7,772,093 B2
(45) Date of Patent: Aug. 10, 2010

(54) METHOD OF AND CIRCUIT FOR PROTECTING A TRANSISTOR FORMED ON A DIE

(75) Inventors: Yuhao Luo, San Jose, CA (US); Shuxian Wu, San Jose, CA (US); Xin X. Wu, Fremont, CA (US); Jae-Gyung Ahn, Pleasanton, CA (US); Deepak Kumar Nayak, Fremont, CA (US); Daniel Gitlin, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 132 days.

(21) Appl. No.: 11/977,810

(22) Filed: Oct. 26, 2007

(65) Prior Publication Data

US 2009/0108337 A1    Apr. 30, 2009

(51) Int. Cl.
*H01L 21/326*    (2006.01)
*H01L 21/479*    (2006.01)

(52) U.S. Cl. .................. 438/467; 257/209; 257/529; 257/E23.146

(58) Field of Classification Search ................ 257/209, 257/528, 529, E23.146, E23.147, E23.149; 438/281, 467
See application file for complete search history.

(56) References Cited

U.S. PATENT DOCUMENTS

| | | | | |
|---|---|---|---|---|
| 5,350,710 A | * | 9/1994 | Hong et al. | 438/467 |
| 5,504,434 A | * | 4/1996 | Schepis et al. | 324/719 |
| 5,587,598 A | * | 12/1996 | Hatanaka | 257/355 |
| 5,691,234 A | * | 11/1997 | Su et al. | 438/647 |
| 5,726,586 A | * | 3/1998 | Chan et al. | 326/40 |
| 5,903,041 A | * | 5/1999 | La Fleur et al. | 257/530 |
| 5,998,299 A | | 12/1999 | Krishnan | |
| 6,365,938 B2 | * | 4/2002 | Lee et al. | 257/355 |
| 7,232,711 B2 | * | 6/2007 | Gambino et al. | 438/132 |
| 2001/0026970 A1 | * | 10/2001 | Eitan et al. | 438/215 |
| 2001/0042887 A1 | | 11/2001 | Lee et al. | |
| 2002/0061630 A1 | * | 5/2002 | Lee et al. | 438/467 |
| 2002/0063298 A1 | | 5/2002 | Wang | |
| 2006/0267137 A1 | * | 11/2006 | Gambino et al. | 257/529 |
| 2008/0122027 A1 | * | 5/2008 | Ueda | 438/467 |

FOREIGN PATENT DOCUMENTS

JP      04158578 A      6/1992

OTHER PUBLICATIONS

Lin, W. , "A New Technique for Measuring Gate-Oxide Leakage in Charging Protected MOSFETS", IEEE Transactions on Electron Devices IEEE USA, vol. 54, No. 4, Apr. 2007, pp. 683-691, ISSN 0018-9383.

\* cited by examiner

*Primary Examiner*—David Vu
*Assistant Examiner*—Earl N Taylor
(74) *Attorney, Agent, or Firm*—John J. King; Thomas George (57) ABSTRACT

A method of protecting a transistor formed on a die of an integrated circuit is disclosed. The method comprises forming an active region of the transistor on the die; forming a gate of the transistor over the active region; coupling a primary contact to the gate of the transistor; coupling a programmable element between the gate of the transistor and a protection element; and decoupling the protection element from the gate of the transistor by way of the programmable element. Circuits for protecting a transistor formed on a die of an integrated circuit are also disclosed.

15 Claims, 6 Drawing Sheets

METHOD OF AND CIRCUIT FOR PROTECTING A TRANSISTOR FORMED ON A DIE

FIELD OF THE INVENTION

The present invention relates generally to integrated circuits, and in particular, to a method of and circuit for protecting a transistor formed on a die.

BACKGROUND OF THE INVENTION

In manufacturing and employing integrated circuit devices, it is important that the devices operate properly. Completed integrated circuit devices are tested, and defective devices are discarded. The percentage of usable dies is called "silicon yield" because it indicates the fraction of usable integrated circuits in a manufactured lot. The large die size of some integrated circuit devices, such as programmable logic devices, results in fewer dies being produced per wafer. Because the number of usable dies significantly impacts profitability, it is important to enable the use of as many of the dies of the wafer as possible. More importantly, when a completed integrated circuit malfunctions after it has been installed in a finished product, such as a consumer electronics device, the malfunction of the integrated circuit may cause the entire product to fail.

Most integrated circuits are formed using a number of material layers. Each layer is patterned to add or remove selected portions to form circuit features that will eventually make up a complete integrated circuit. Various layers are formed above the die to enable connections to the elements of the die and the creation of certain devices, such as transistors. In manufacturing integrated circuits, plasma processing steps are often used to deposit or remove materials on semiconductor wafers, such as during etching or dielectric deposition. Plasma processing is well known in the art of manufacturing integrated circuits. However, the use of plasma may cause destructive charges (e.g., positive ions) to build up above the surface of the wafer. If the build up of the charge is large enough, and the charge has no leakage path to the wafer, a current will flow through the transistor gate oxide, causing damage to the gate oxide. In particular, the damage occurs when the ratio between the plasma collect area, commonly called the antenna area, and gate and diffusion areas exceeds a certain value. This damage is particularly severe for test structure devices, such as transistors having small gate and diffusion areas. Further, the minimum critical dimensions such as decreased gate areas of currently produced integrated circuits have also increased this ratio. The damage to the gate oxide may lead to performance degradation of the transistor, or result in reliability failures.

Another aspect of integrated circuit manufacturing where defects may occur is wire bonding. Wire bonds are used to connect a bond pad on one element of a device, such as a die, to a bond pad on another element, such as a substrate of the integrated circuit receiving the die. High voltage, such as electrostatic discharge (ESD) caused by handling and bonding, may damage the gate oxide.

Accordingly, there is a need for an improved method of and circuit for protecting a transistor formed on a die.

SUMMARY OF THE INVENTION

A method of protecting a transistor formed on a die of an integrated circuit having programmable logic is disclosed. The method comprises forming an active region of the transistor on the die; forming a gate of the transistor over the active region; coupling a primary contact to the gate of the transistor; coupling a programmable element between the gate of the transistor and a protection element; and decoupling the protection element from the gate of the transistor by way of the programmable element. Coupling a programmable element between the gate of the transistor and a protection element may comprise coupling a programmable element between the gate of the transistor and a diode, or coupling a programmable element between the gate of the transistor and a secondary contact for receiving a contact.

A circuit for protecting a transistor during the manufacture of an integrated circuit device is also disclosed. The circuit comprises a transistor having a gate formed over an active region formed in a die of the device; a protection element formed in the die of the device; and a programmable element coupled between the gate of the transistor and the protection element, the programmable element enabling the protection element to be decoupled from the transistor after the formation of the transistor in the device. The device may further comprise a contact pad between the programmable element and the protection element.

According to an alternate embodiment, a circuit for protecting a transistor during the manufacture of an integrated circuit device comprises a transistor having a gate formed over an active region formed in a die of the device; a contact pad adapted to receive a contact, a capacitor coupled to the contact pad; and a programmable element coupled between the gate of the transistor and the capacitor, the programmable element enabling the capacitor to be decoupled from the transistor after the formation of the integrated circuit device. The capacitor may comprise a first plate comprising a diffusion region and a second plate comprising a metal layer. The capacitor preferably comprises an insulator having an area larger than the area occupied by the gate.

DETAILED DESCRIPTION OF THE DRAWINGS

Figure 1:
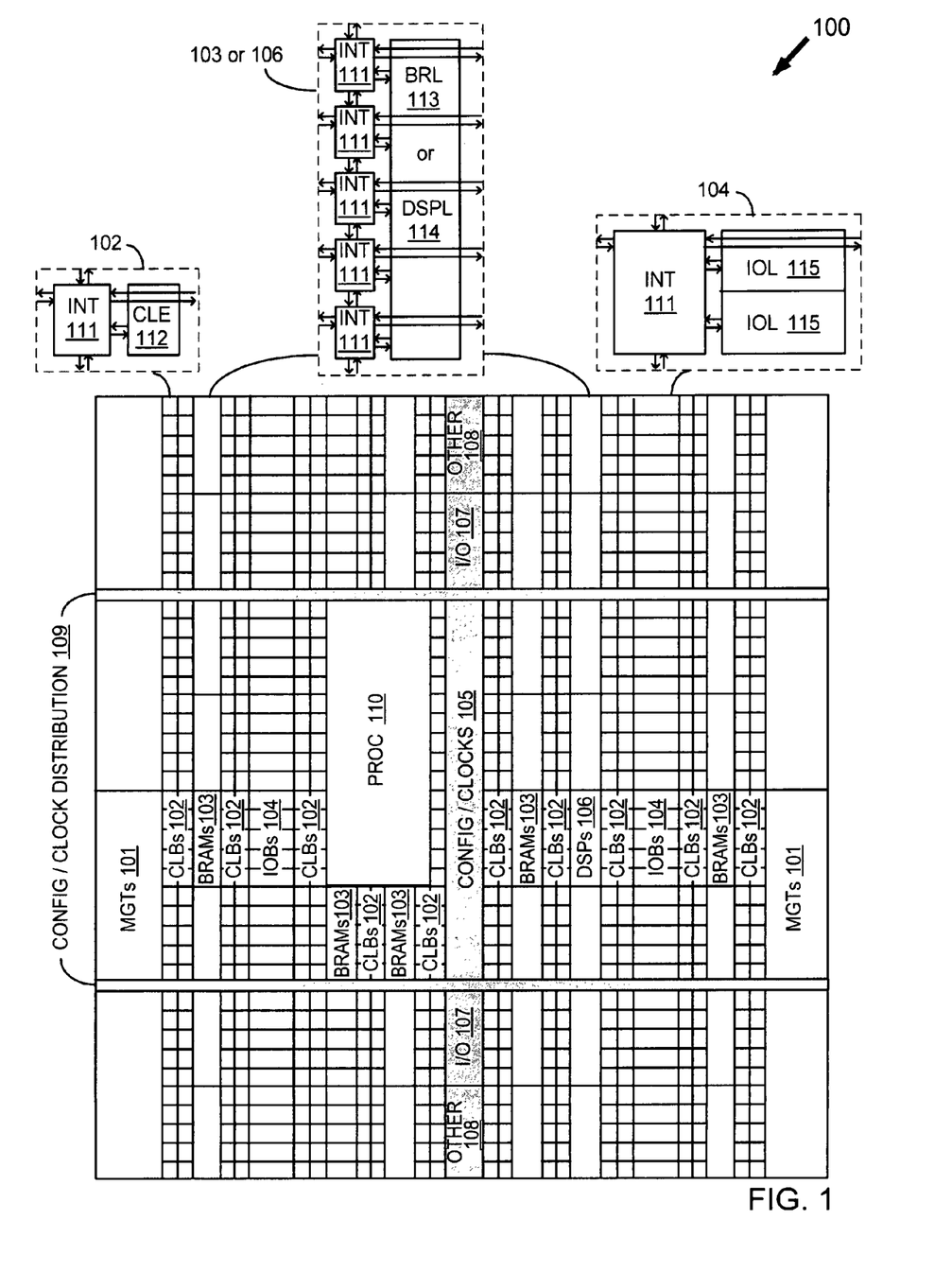
FIG. 1 is a programmable logic device according to an embodiment the present invention.

Turning first to FIG. 1, a programmable logic device according to an embodiment the present invention is shown. A programmable logic device is designed to be user-programmable so that users may implement logic designs of their choices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

Advanced FPGAs may include several different types of programmable logic blocks in the array. For example, FIG. 1 illustrates an FPGA architecture that includes a large number of different programmable tiles comprising programmable logic including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
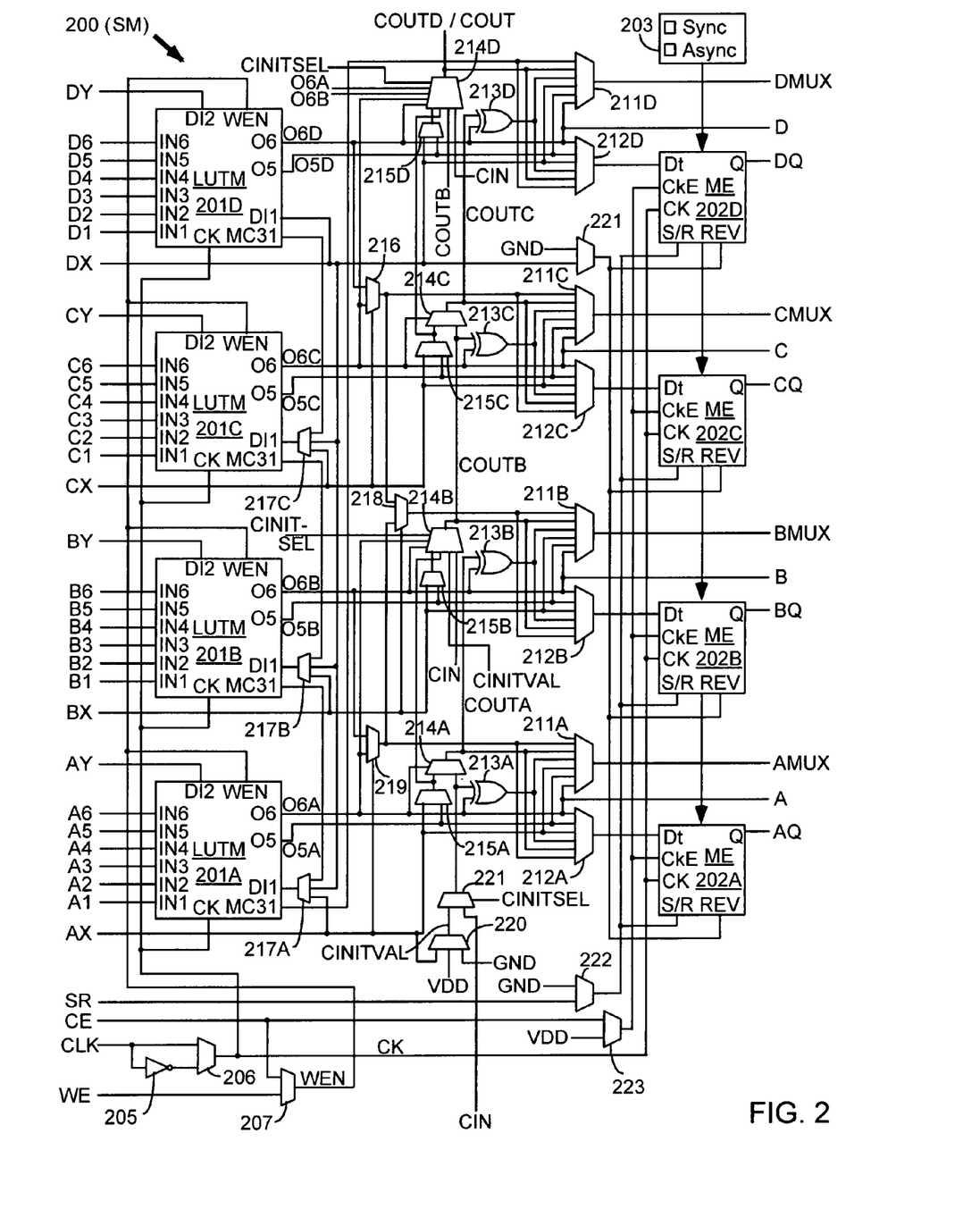
FIG. 2 is a configurable logic element of the programmable logic device of FIG. 1 according to an embodiment of the present invention.

Turning now to FIG. 2, a block diagram of a configurable logic element of the programmable logic device of FIG. 1 according to an embodiment of the present invention is shown. In particular, FIG. 2 illustrates in simplified form a configurable logic element of a configuration logic block 102 of FIG. 1. In the embodiment of FIG. 2, slice M 200 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 111, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic comprising multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A, for example, may also be provided to the general interconnect structure for shift register chaining, via output select multiplexer 211D and CLE output terminal DMUX.

Figure 3:
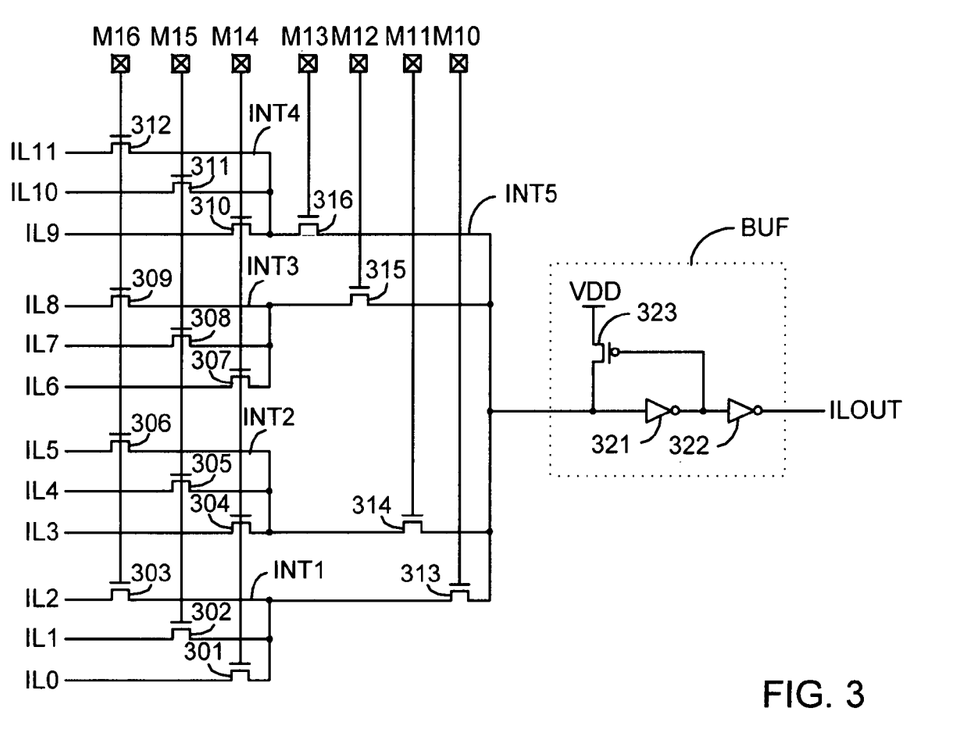
FIG. 3 is a circuit diagram of a programmable interconnect circuit according to an embodiment of the present invention.

Turning now to FIG. 3, a circuit diagram of a programmable interconnect circuit according to an embodiment of the present invention is shown. Programmable interconnect points (PIPs) are often coupled into groups that implement multiplexer circuits selecting one of several interconnect lines to provide a signal to a destination interconnect line. A routing multiplexer may be implemented, for example, as shown in FIG. 3. The illustrated circuit selects one of several different input signals and passes the selected signal to an output terminal. Note that FIG. 3 illustrates a routing multiplexer with twelve inputs, but PLD routing multiplexers typically have many more inputs, e.g., 20, 24, 28, 30, 36, or some other number. However, FIG. 3 illustrates a smaller circuit, for clarity.

The circuit of FIG. 3 includes twelve input terminals IL0-IL11 and sixteen pass gates 301-316. Pass gates 301-303 selectively pass one of input signals IL0-IL3, respectively, to a first internal node INT1. Each pass gate 301-303 has a gate terminal driven by a configuration memory cell M14-M16, respectively. Similarly, pass gates 304-306 selectively pass one of input signals IL3-IL5, respectively, to a second internal node INT2. Each pass gate 304-306 has a gate terminal driven by one of the same configuration memory cells M14-M16, respectively. From internal nodes INT1, INT2, pass gates 313, 314 are controlled by configuration memory cells M10, M11, respectively, to selectively pass at most one signal to another internal node INT5.

Pass gates 307-312 and 315-316 are similarly controlled by configuration memory cells M12-M16 to select one of input signals IL6-IL11 and to pass the selected input signal via one of internal nodes INT3, INT4 to internal node INT5, as shown in FIG. 3.

The signal on internal node INT5 is buffered by buffer BUF to provide output signal ILOUT. Buffer BUF includes two inverters 321, 322 coupled in series, and a pull-up (e.g., a P-channel transistor 323 to power high VDD) on internal node INT5 and driven by the node between the two inverters.

Thus, values stored in configuration memory cells M10-M16 select at most one of the input signals IL0-IL11 to be passed to internal node INT5, and hence to output node ILOUT. If none of the input signals is selected, output signal ILOUT is held at its initial high value by pull-up 323. The devices having programmable logic and methods of the present invention may be implemented according to the device of FIGS. 1-3, or in any device, including any type of integrated circuit having programmable logic. For example, the circuit of FIG. 3 or other programmable features of FIGS. 1-3 could be used as a programmable element, which will be described in more detail below.

According to one embodiment of the invention, a programmable element is inserted between a main device, such as a transistor, and a protection device, such as a diode. The main device may be any device needing protection from the effects of plasma processing or any other processes leading to the build up of excess charge, and particularly building up charge on any portion of a circuit having thin oxide. As shown in the top plan view of a circuit for protecting a transistor formed on a die of FIG. 4 and the corresponding cross-sectional view of FIG. 5, a die 402 comprises a transistor 403 having a diffusion region 404 comprising an active region of the transistor. A drain contact 406 is coupled between the drain of the transistor and a metal layer 408 which provides a contact pad for the drain. Similarly, a source contact 412 is coupled between the source of the transistor and a metal layer 414 which provides a contact pad for the source. A poly silicide layer 416 comprising a gate of the transistor is coupled by a contact 418 to metal layer 420, which may be coupled to a programming pad 421 comprising a primary contact for enabling programming. A programmable element 422 extends from the metal contact 420 by way of a contact 424 to a diode contact 426. As will be described in more detail below, the programming pad 421 will enable both eliminating the programmable element after testing and accessing the gate of the transistor.

Figure 5:
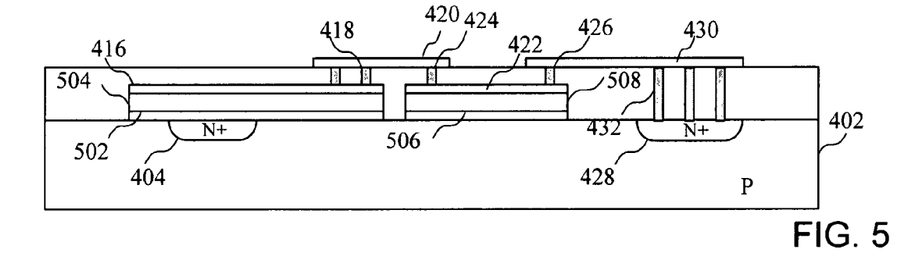
FIG. 5 is a cross-sectional view of the circuit of FIG. 4 according to an embodiment of the present invention.

The diode contact 426 is coupled to a diode 428 comprising an N+ diffusion region by way of a metal layer 430 and a contact 432. A contact pad 434 of the metal layer 430 comprising a secondary contact pad also provides access to enable opening the programmable element 422 to isolate the diode from the transistor. As also shown in FIG. 5, the transistor 403 comprises an oxide layer 502 and a polysilicon gate region 504 on the diffusion region 404. The oxide layer and the polysilicon layer are also used in forming the programmable element 422. While the programmable element is shown as a portion of a poly silicide layer, the programmable element may be a fuse comprising any other element of the device which may be opened, such as a narrow metal line, a polysilicon efuse, a contact, or a via, for example. The programmable element 422 of FIG. 5 comprising the poly silicide layer may be opened by applying a current across the programmable element. For example, a voltage may be applied to the contact pad 434 while coupling the programming pad 421 to ground to induce current through the programmable element to create an open contact between the diode and the transistor. Accordingly, after finishing wafer processing, the programmable element may be programmed to open to isolate the main device, shown here as a transistor. That is, the programmable element may be eliminated at any time after plasma processing steps are completed, including after the integrated circuit device is completely assembled.

Figure 6:
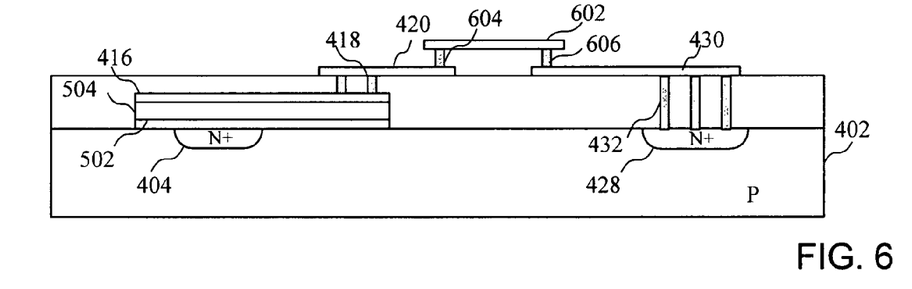
FIG. 6 is a cross-sectional view of the circuit of FIG. 4 according to an alternate embodiment of the present invention.

According to an alternate embodiment of FIG. 6, a protection diode is detachably coupled to the gate of the transistor 403 by forming a configurable interconnect between the metal contact 420 providing a connection to the gate of the transistor 403 and the metal layer 430 providing a connection to the diode 428. According to one aspect of the circuit of FIG. 6, the interconnect line may be programmed to provide the connection between the transistor 403 and the diode 428 during a test phase according to a first configuration bitstream loaded into the programmable logic device. However, after testing is complete, a second configuration bitstream for implementing a specific design would configure the device so that interconnect 602 is not present. By way of example, the configuration bitstream could comprise different bits setting the configuration memory elements of the circuit of FIG. 3 so that the interconnect 602 is present during the test phase, but not present during the implementation of the specific design.

Figure 4:
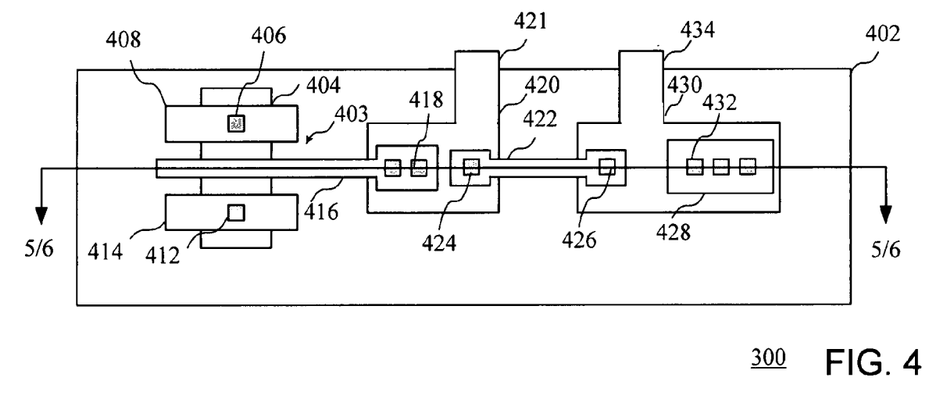
FIG. 4 is a top plan view of a circuit for protecting a transistor formed on a die according to an embodiment of the present invention.

According to the embodiments of FIGS. 4-6, the plasma damage to the transistor is avoided during the wafer processing because the protection diode is connected to a polysilicon gate of the transistor by way of the programmable element. Because the programmable element is opened (as in FIG. 5) or reconfigured (as in FIG. 6) after finishing processing, there will be no impact on the characterization of the transistor from the diode. Although a transistor is shown by way of example, the circuit of the present invention could be used with any device having an oxide or other layer which may be damaged as a result of plasma processing.

Figure 7:
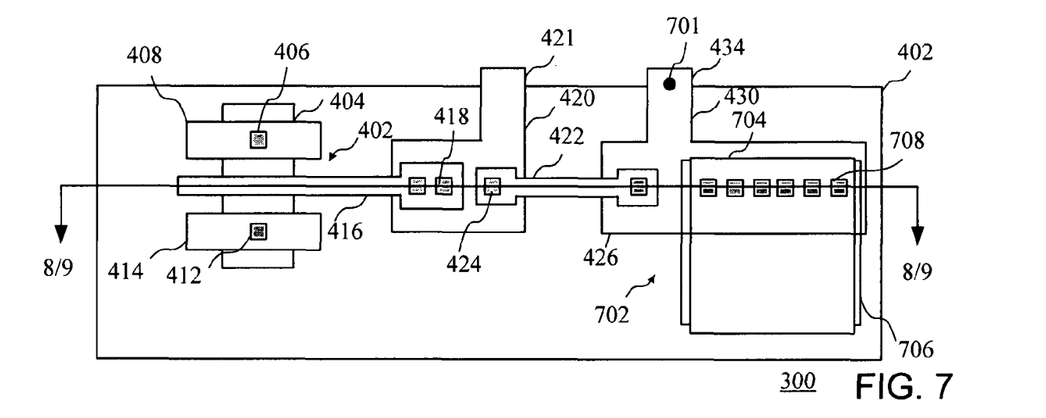
FIG. 7 is a top plan view of a circuit for protecting a transistor formed on a die according to an alternate embodiment of the present invention.
Figure 8:
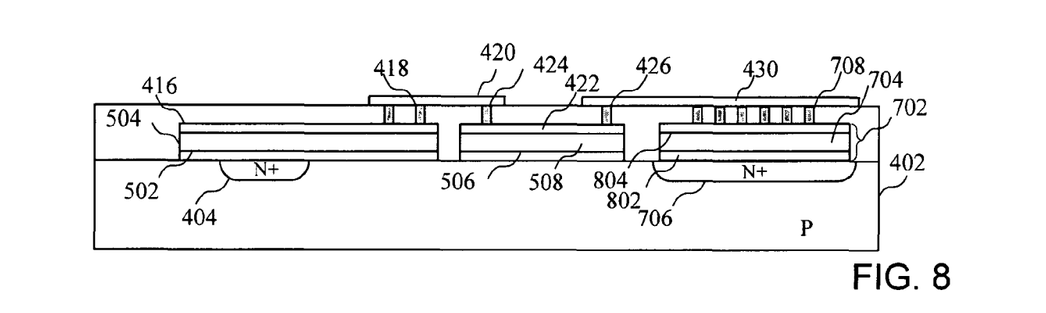
FIG. 8 is a cross-sectional view of the circuit of FIG. 7 according to an embodiment of the present invention.
Figure 9:
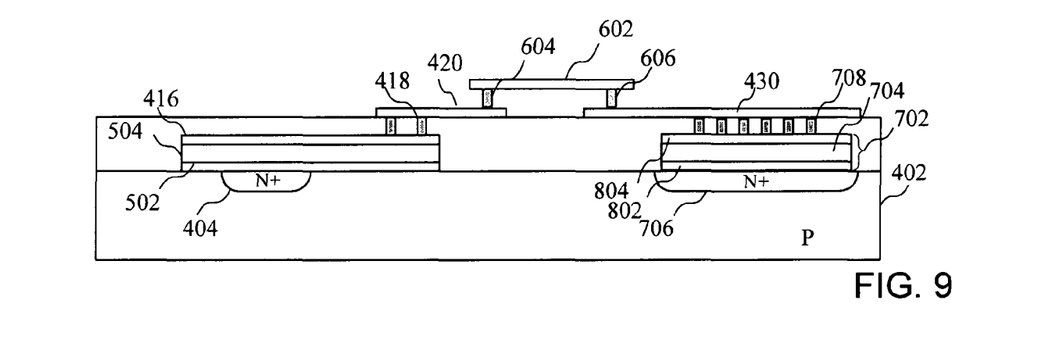
FIG. 9 is a cross-sectional view of the circuit of FIG. 7 according to an alternate embodiment of the present invention.

Turning now to FIG. 7, a top plan view of a circuit for protecting a transistor formed on a die according to an alternate embodiment of the present invention is shown. For advanced CMOS technology, the gate oxide of transistors is very thin and the leakage current is high. Because the oxide is so brittle, a protection diode between the polysilicon gate and the substrate may not work well to protect the device from oxide damage due to electrostatic discharge when applying a test probe or during wirebonding. Due to gate leakage concerns, transistors are formed with small gate oxide areas. However, a smaller gate oxide area is even more prone to damage. When applying a contact 701, such as a wire bond during wire bonding or a probe of a probe head of test equipment, the gate oxide is easily damaged. The circuit of FIG. 7 illustrates a circuit to protect a device from damage when applying a contact. The circuit is isolated after reliability stress and testing. According to the embodiment of FIG. 7, a protection device comprising a capacitor is coupled by a programmable element to the transistor to enable testing by the application of probes or applying wire bonds to a contact pad having a discharge path to a conductive layer forming the capacitor. The capacitor has a larger area than the transistor (e.g., an insulator, such as an oxide layer, of the capacitor may have an area larger than the gate oxide area), and thereby reduces damage to the gate oxide of the transistor. In particular, a capacitor 702 comprises a first capacitor plate 704 above the second capacitor plate 706. As shown in FIG. 8, the first capacitor plate 704 comprises a polysilicon layer and the second capacitor plate comprises a diffusion region. The contact pad 434 is coupled to the first capacitor plate 704 by a poly silicide layer 804 and a contact 708. Accordingly, the capacitor may also be isolated from the transistor by eliminating the programmable element 422 of FIG. 8 or 602 of FIG. 9. As shown in FIG. 8, the oxide layer 802 forms the insulator layer of the capacitor. While the embodiment of FIGS. 4 and 8 are shown separately, both embodiments could be implemented in a single device.

Accordingly, a protection device is connected to a main device to eliminate the damage during bonding and packaging. By inserting a programmable element between the main device and a capacitor, the programmable element may be programmed after packaging to open to isolate the main device from the capacitor used only during testing. The capacitor preferably provides a large area gate oxide region for protection to test the device and/or avoid oxide damage during bonding. Due to the large total gate oxide area, the chance of damage to the gate oxide is reduced. That is, due to the distribution probability of the gate oxide breakdown, any damage to the gate oxide will tend to occur on the protection capacitor, which has a much larger area. After bonding and packaging, the programmable element is opened, eliminating any effect of the capacitor on the transistor.

Figure 10:
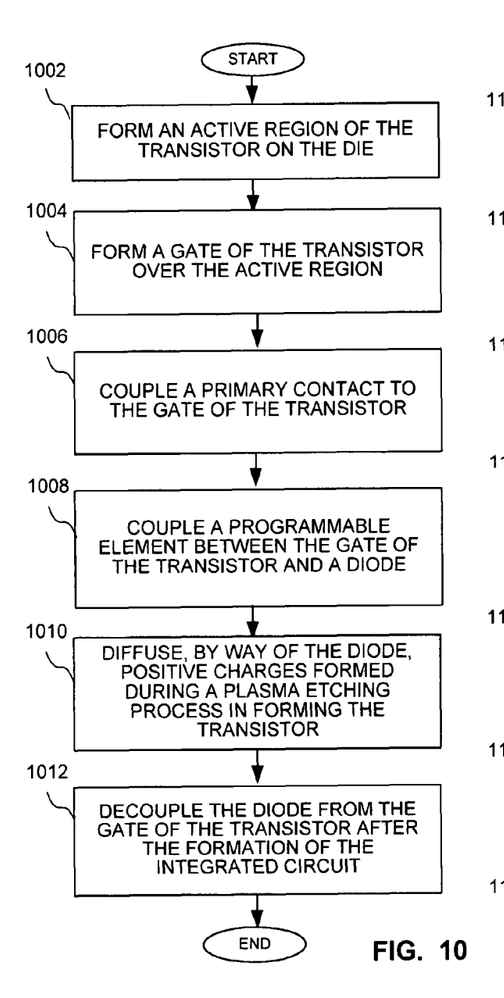
FIG. 10 is a flow chart showing a method of manufacturing an integrated circuit according to an embodiment of the present invention.

Turning now to FIG. 10, a flow chart shows a method of manufacturing an integrated circuit according to an embodiment of the present invention. In particular, an active region of the transistor is formed on the die at a step 1002. A gate of the transistor is formed over the active region at a step 1004. A primary contact is coupled to the gate of the transistor at a step 1006. A programmable element is coupled between the gate of the transistor and a diode at a step 1008. Positive charges formed during a plasma etching process in forming the transistor will be diffused by way of the diode at a step 1010. The diode is then decoupled from the gate of the transistor after the formation of the integrated circuit at a step 1012.

Figure 11:
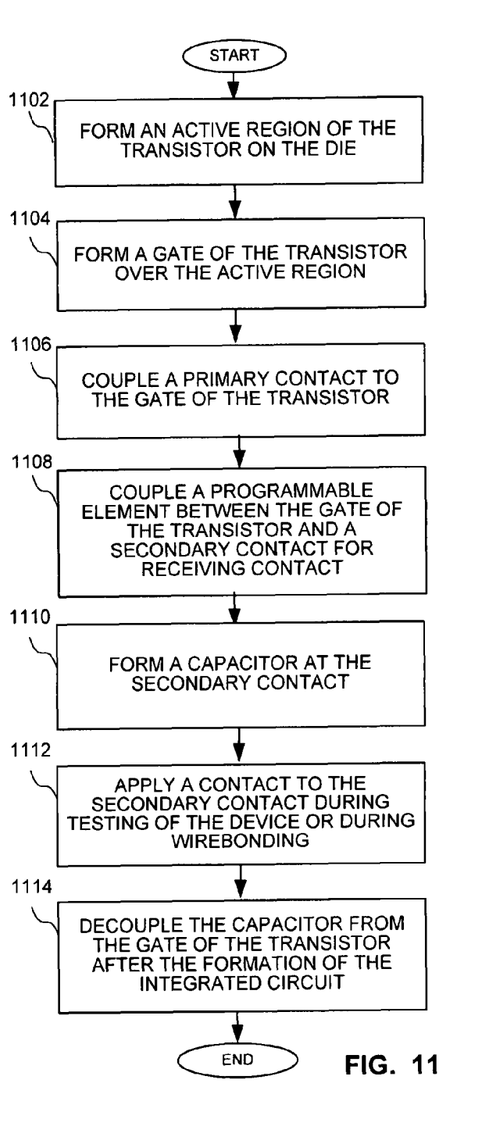
FIG. 11 is a flow chart showing a method of manufacturing an integrated circuit according to an alternate embodiment the present invention.

Finally, a flow chart of FIG. 11 shows a method of manufacturing an integrated circuit using a capacitor according to an alternate embodiment the present invention. An active region of the transistor is formed on the die at a step 1102, and a gate of the transistor is formed over the active region at a step 1104. A primary contact is coupled to the gate of the transistor at a step 1106. A programmable element is then coupled between the gate of the transistor and a secondary contact for receiving a contact during testing or wirebonding at a step 1108. A capacitor is formed at the secondary contact at a step 1110. A contact is applied to the secondary contact during testing of the device or wirebonding at a step 1112. The capacitor is then decoupled from the gate of the transistor after the formation of the integrated circuit at a step 1114. The methods of FIGS. 10 and 11 may be implemented using any of the circuits of FIGS. 1-9 as described above, or any other suitable circuits.

It can therefore be appreciated that the new and novel method of and device having programmable logic for protecting a transistor formed on a die has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of protecting a transistor formed on a die of an integrated circuit, the method comprising:
    forming an active region of the transistor on the die;
    forming a gate of the transistor over the active region;
    coupling a primary contact to the gate of the transistor;
    coupling a programmable element between the gate of the transistor and a protection element; and
    decoupling, after the formation of the integrated circuit, the protection element from the gate of the transistor by way of the programmable element in order to isolate the transistor from the protection element,
    wherein the programmable element is a programmable interconnect, and further comprising providing configuration memory elements that set the programmable interconnect so that it is present or not present.

2. The method of claim 1 wherein coupling the programmable element between the gate of the transistor and the protection element comprises coupling the programmable element between the gate of the transistor and a diode.

3. The method of claim 2 further comprising diffusing, by way of the diode, positive charges formed during a plasma processing step in forming the transistor.

4. The method of claim 1 wherein coupling the programmable element between the gate of the transistor and the protection element comprises coupling a programmable element between the gate of the transistor and a secondary contact for receiving a test probe during testing.

5. The method of claim 4 further comprising forming a capacitor coupled to the secondary contact.

6. The method of claim 5 further comprising forming a wire bond to the secondary contact.

7. The method of claim 1 further comprising setting the configuration memory elements using bits of a configuration bitstream so that the programmable interconnect is present or not present.

8. A method of protecting a transistor formed on a die of an integrated circuit, the method comprising:
forming an active region of the transistor on the die;
forming a gate of the transistor over the active region;
coupling a contact to the gate of the transistor;
coupling a programmable element between the gate of the transistor and a protection element;
diffusing, by way of the diode, positive charges formed during a plasma processing step in forming the transistor; and
decoupling, after the formation of the integrated circuit, the protection element from the gate of the transistor by way of the programmable element in order to isolate the transistor from the protection element,
wherein the programmable element is a programmable interconnect, and further comprising providing configuration memory elements that set the programmable interconnect so that it is present or not present.

9. The method of claim 8 further comprising setting the configuration memory elements using bits of a configuration bitstream so that the programmable interconnect is present or not present.

10. The method of claim 8 wherein the diode comprises a diffusion region in a substrate of the integrated circuit.

11. The method of claim 8 wherein the programmable element may provide an open circuit between the gate of the transistor and the protection element after the formation of the integrated circuit.

12. A method of protecting a transistor formed on a die of an integrated circuit, the method comprising:
forming an active region of the transistor on the die;
forming a gate of the transistor over the active region;
coupling a primary contact to the gate of the transistor;
coupling a programmable element between the gate of the transistor and a protection element;
coupling, during the formation of the integrated circuit, a conductor to a secondary contact which is coupled to the transistor by way of the protection element; and
decoupling, after the formation of the integrated circuit, the protection element from the gate of the transistor by way of the programmable element in order to isolate the transistor from the protection element and the secondary contact,
wherein coupling a conductor to a secondary contact comprises coupling a test probe or a wire bond to a plate of a capacitor.

13. The method of claim 12 wherein the programmable element is a programmable interconnect, and further comprising providing configuration memory elements that set the programmable interconnect so that it is present or not present.

14. The method of claim 13 further comprising setting the configuration memory elements using bits of a configuration bitstream so that the programmable interconnect is present or not present.

15. The method of claim 12 wherein the programmable element may provide an open circuit between the gate of the transistor and the protection element after the formation of the integrated circuit.

\* \* \* \* \*